US006222194B1

(12) United States Patent
Regan

(10) Patent No.: US 6,222,194 B1
(45) Date of Patent: Apr. 24, 2001

(54) FAST NEUTRON IRRADIATION OF SAPPHIRE

(75) Inventor: Thomas M Regan, Westford, MA (US)

(73) Assignee: Aspen Systems, Inc., Marlborough, MA (US)

( * ) Notice: Subject to any disclaimer, the term of this patent is extended or adjusted under 35 U.S.C. 154(b) by 0 days.

(21) Appl. No.: 09/052,192

(22) Filed: Mar. 31, 1998

Related U.S. Application Data

(60) Provisional application No. 60/042,145, filed on Mar. 31, 1997.

(51) Int. Cl.[7] ................................................... C04B 40/00
(52) U.S. Cl. ......................................................... 250/492.1
(58) Field of Search ......................... 250/492.1; 376/158; 264/82, 1.21, 235, 346

(56) References Cited

U.S. PATENT DOCUMENTS 5,200,370 * 4/1993 Lennox et al. ........................ 501/95
5,702,654 * 12/1997 Chen et al. ........................... 264/82

* cited by examiner

*Primary Examiner*—Kiet T. Nguyen
(74) *Attorney, Agent, or Firm*—Bruce F. Jacobs

(57) ABSTRACT

Methods of irradiating sapphire with fast neutron radiation to form a sapphire body having high compressive strength at elevated temperature and use thereof in sapphire window assemblies, bearing assemblies, semi-conductor devices, and optical fibers. The sapphire assemblies and methods for making them.

18 Claims, 5 Drawing Sheets

FAST NEUTRON IRRADIATION OF SAPPHIRE

CROSS-REFERENCE TO RELATED APPLICATION

This application claims priority from pending provisional application U.S. Ser. No. 60/042,145, filed Mar. 31, 1997.

U.S. GOVERNMENT RIGHTS

The U.S. Government has certain rights in this invention based upon Contract No. N68936-97-C-0005 with the Department of the Navy.

FIELD OF THE INVENTION

The present invention relates to the field of materials science, more particularly the production and use of sapphire bodies with increased strength at elevated temperature, particularly compressive strength. The invention further relates to sapphire windows, bearing assemblies, semiconductor support materials, or fiber optic devices, which are exposed to high temperature compressive conditions either during manufacture or use.

BACKGROUND OF THE INVENTION

Conventional methods have failed to create sapphire bodies which exhibit sufficient compressive strength at high temperatures to be useful in many applications. When exposed to elevated temperature, sapphire is generally believed to lose strength at least partially because of "twinning" wherein twin planes slip along adjoining regions. Twinning results in a reorientation of the planes of atoms in one slice of a crystal relative to the alignment in neighboring regions. Twins appear very sharp in cross-polarized light because of the shift in orientation.

Prior attempts to increase the strength of sapphire at elevated temperature have included both ion implantation utilizing particle accelerators and solid solution strengthening methods. Ion implantation techniques have failed, at least in part due to the fact that they only modify the extreme outer portion of a sapphire body due to the shallow range of heavy ion penetration. Solid solution strengthening methods, on the other hand, are based upon introducing substitutional alloys into sapphire during crystal growth by adding small quantities of an inert material during crystal growth. The impurities in the sapphire structure can impede dislocation movements and result in more stable structures, but the materials have still been found to exhibit poor strength or poor optical properties when the sapphire is placed in an elevated temperature environment.

Harris et al, *Mechanism of Mechanical Failure of Sapphire at High Temperature,* Proc. SPIE, Volume 2286 (1995) discloses that the compressive strength of sapphire (single crystal $Al_2O_3$) at 800° C. was reduced by more than 95% of its room temperature value. Harris et al, Mechanical Strength of Sapphire at Elevated Temperature, Proceedings of the 6th DoD Electromagnetic Windows Symposium, Huntsville, AL, Oct. 16–19, 1995 discloses that sapphire specimens had a compressive strength at 800° C. of only from 29 to 45 MPa and similar low compressive strength at 600° C. Others have reported similar relatively low compressive strengths at high temperature when varying the crystal growth method (edge-defines film-fed growth (EFG) vs. heat exchanger method (HEM)), surface finish (as-grown vs. polished), and test atmosphere (air vs. argon).

Dients et al, *J. Nucl. Mater.,* 191–194 (Pt. A), 555–9 (1992) discloses that alumina, aluminum nitride, and silicon carbide exhibit a reduction in bending strength at 400–600° C. after neutron irradiation at $10^{24}$ and $10^{26}$ n/m$^2$ ($10^{20}$ and $10^{22}$ nvt). Unless otherwise specified, "nvt" is used herein refers to a neutron flux in neutrons/cm$^2$ for neutrons $\geq 1$ MeV. At $10^{26}$ n/m$^2$ ($10^{22}$ nvt), the mean ultimate bending strength was reported to be 50–60% of the original strength of the material. The loss of strength after irradiation was always accompanied by a large decrease of the Weibull modulus. No considerable difference was found at a fluence of about $5 \times 10^{24}$ n/m$^2$ ($5 \times 10^{20}$ nvt).

Pells, *Radiation Damage Effects in Alumina,* Journal of Nuclear Materials 191–194 (1992) 555–559 reports that the a- and c-axes of sapphire increase in length, for 14–meV neutron fluences on the order of $10^{20}$ n/m$^2$ ($10^{16}$ nvt) at 325° K.

Heidinger et al, *The Impact of Neutron Irradiation on the Performance of Cryogenically Cooled Windows for Electron Cyclotron Resonance Heating,* Fusion Engineering and Design 18 (1991) 337–340 discloses dielectric loss tangent and thermal conductivity calculations for a limited set of data. The calculations are based on data of sapphire irradiated at $3.5 \times 10^{19}$ f.n. (fast neutrons)/cm$^2$, $(1.5-50.2) \times 10^{17}$ f.n./cm$^2$ and $(0.3-18) \times 10^{19}$ f.n./cm$^2$. Heidinger et al disclose sapphire disks used in gyrotrons and torous windows in devices used for electron resonance heating fusion plasmas.

It has now been unexpectedly discovered that a sapphire body having high strength at elevated temperature can be produced by controlled neutron irradiation processing to introduce point defects within the body.

It is an object of this invention to produce sapphire bodies having increased compressive strength at elevated temperature by irradiating sapphire with a limited amount of fast neutrons.

It is a further object of this invention to develop strengthened sapphire bodies that exhibit desirable transmission characteristics in the midwave region.

These and still further objects will be apparent from the following description of this invention.

SUMMARY OF THE INVENTION

The present invention is directed to a process of irradiating sapphire with fast neutron radiation to increase the strength of the sapphire and a material so produced. The process generally entails placing a sapphire body in or near a radiation source and exposing the body to radiation of an integrated fluence ranging from about $1 \times 10^{17}$ nvt to about $9 \times 10^{19}$ nvt.

Preferably the process entails encasing a sapphire body inside a radiation filter which absorbs or reflects low energy thermal neutrons, placing the encased body in a radiation reactor, passing radiation through the filter to the sapphire body, and controlling the extent of radiation to an integrated fluence ranging from about $1 \times 10^{17}$ nvt to about $9 \times 10^{19}$ nvt. Use of the filter allows the preparation of sapphire bodies which require substantially less storage prior to being safe for use.

The invention is further directed to a sapphire body produced by the method and the use of the body in a sapphire window assembly which is exposed to a temperature of at least about 500° C.

The invention is further directed to a sapphire body which, at temperatures of 400° C. and above, exhibits a c-axis compressive strength which is greater than both the c-axis and a-axis tensile strengths of prior sapphire bodies.

The invention is further directed to a sapphire body which at a temperature of 600° C. exhibits a c-axis compressive strength of at least 550 MPa.

DESCRIPTION OF PREFERRED EMBODIMENTS

Figure 1:
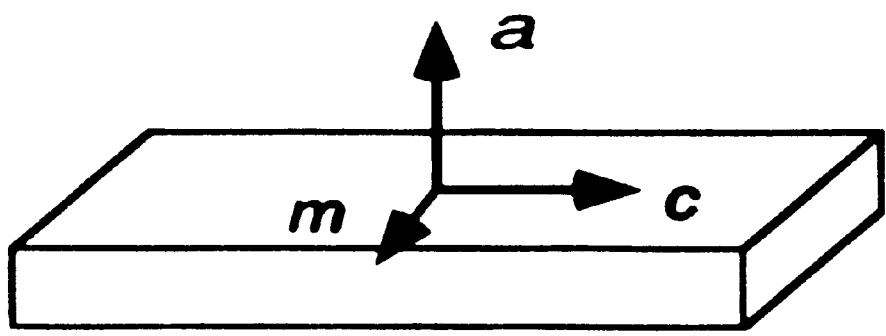
FIG. 1 identifies the axes of a sapphire body as used herein.

As used herein, the following terms have the following meanings. The term "sapphire" refers to a synthetically produced body having a substantially single-crystal $AL_2O_3$ structure. The term "compressive strength" refers to the c-axis compressive strength, i.e. along the optical axis of the body. The c, m, and a axes used herein are identified in FIG. 1. The term "window" is used herein to refer to both flat and curved structures.

The irradiated sapphire body of the present invention is preferably prepared by encasing a sapphire body within a neutron filter material which removes low energy thermal neutrons which cause the irradiated body to exhibit radiated energy levels less than twice the background within about 1 month of irradiation. In the absence of filters, the sapphire bodies generally require at least 6 months for the radiated energy levels to be reduced. These specific times are based upon a 10 gram sample and will change depending upon sample size, though the benefity of using the filter remains. Preferably the neutron filter removes substantially all neutrons having an energy level below the level at which the neutron possesses sufficient energy to produce significant atom displacements within the targeted material (corresponding to about 0.1 MeV (megaelectron volts) (100,000 eV)) while permitting all other neutrons to pass through unimpeded. Currently, no filter material has been found to cut off at exactly the desired energy level while not becoming excessively radioactive. Thus, either more low energy neutrons are present than is optimal or else neutrons with energy levels above 0.1 MeV are removed. Suitable filters include cadmium (which removes neutrons below about 0.5 ev (electron volts), boron 10 (which removes neutrons below about 1.0 MeV), and combinations thereof. Other such materials which do not become excessively radioactive may be used. Boron-10 is preferably used in the form of a boron doped aluminum sheet containing about 4 or more mg of boron per square centimeter. Such a material is commercially available from companies such as Eagle Pitcher Co. and others. To protect the sapphire body during the irradiation, a simple box-like structure surrounding the body can be prepared from the filter material. Generally the filters are in the form of relatively thin sheets and overlapped structures are readily generated by bending the materials around themselves. Alternatively, the sides of the box can be joined together by a braze or the like.

Since no filter is 100% effective, the use of a combination of filter materials is preferable. In this case, the filter material which removes the lower energy neutrons is placed farthest away from the sapphire body.

The irradiated sapphire body is made by placing the filter material encased unirradiated sapphire body in or near a fast neutron source. The sapphire body may have planar and/or curved surfaces in any shape (spherical, rectangular, cylindrical, or the like). Bodies with flat surfaces are preferably rectangular. Bodies having curved surfaces are preferably dome-shaped. Suitable unirradiated sapphire bodies may be obtained from Crystal Systems, Inc., Salem, Mass.

The unirradiated sapphire body may be made by any method that produces a synthetically produced body having a substantially single-crystal $Al_2O_3$ structure. Suitable methods for making such bodies include the heat exchanger growth method and the edge defined film growth (EFG) method. Bodies made by the Czochraiski (CZ) method may also be usable. Preferably, the sapphire body is made by the heat exchanger method. The sapphire body may be contoured into a suitable shape with suitable cutting devices, preferably before undergoing irradiation.

For use as a window and to ensure high transmittance properties, the surfaces of the body are polished, preferably prior to neutron irradiation. Suitable techniques for making flat windows include those techniques discussed in Pollicove, *Computer-Aided Optics Manufacturing Technology Development,* Proceedings from SSSCAR at the Center for Optics Manufacturing, Huntsville, Ala. Mar. 12, 1997. Suitable techniques for making domes include those techniques discussed in Schmid et al. *Current Status of Sapphire Dome Production,* Window and Dome Technologies and Materials IV, Vol. 2286 Proceedings Reprint, SPIE Proceedings, Jul. 26–28, 1994 San Diego, Calif.

The sapphire body is irradiated with a controlled amount of neutron radiation to induce changes in the crystal structure of the sapphire to increase of the compressive strength of the body. Generally, the neutrons are believed to uniformly implant point defects (vacancies and interstitials) in the sapphire crystal lattice. The neutron radiation is believed to stabilize twin planes in the sapphire body such that the planes do not slip, and thereby increase the high temperature compressive strength.

Figure 4:
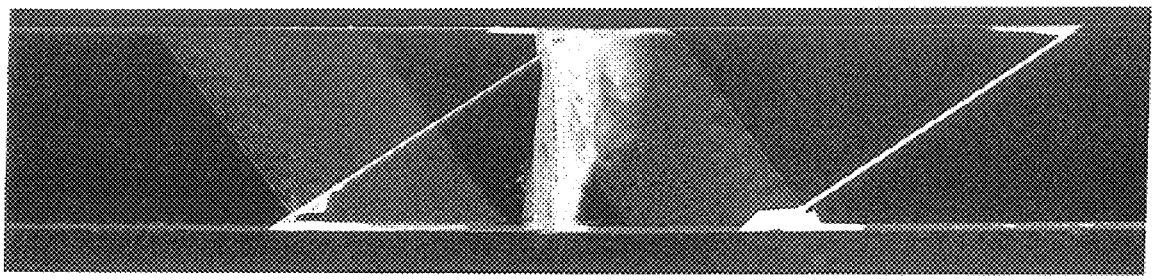
FIG. 4 shows a c-axis compression twin-caused failure of an untreated sapphire body of the prior art.
Figure 5:
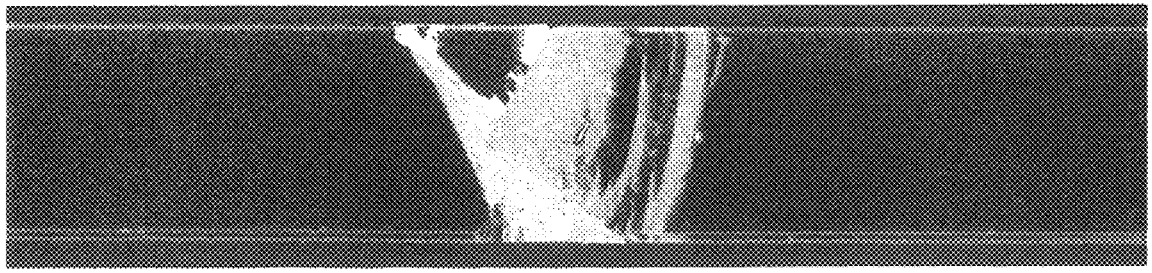
FIG. 5 shows a c-axis tensile failure of a sapphire body of the present invention in which twins are not present.

The effect of the irradiation process can be seen by comparing FIGS. 4 and 5. FIG. 4 is a picture of a c-axis failure of an untreated sapphire flexure coupon of the prior art when tested at 600° C. The Figure shows that the failure was in compression 20. The body exhibited a strength of 203 MPa. FIG. 5, on the other hand, is a picture of a c-axis failure of a sapphire flexure coupon treated in accordance of the present invention by irradiation to a fluence of $1\times10^{18}$ as described in Example 1. This coupon failed in tension 22, not compression, and exhibited a c-axis compressive strength of 511 MPa at 600° C. These figures visually demonstrate the effect of the irradiation treatment in changing the mode of failure from compression to tension.

Neutrons are neutral particles which are not subject to Coulombic forces and, therefore, the mean path length of a neutron in a sapphire body is on the order of several centimeters (compared to micron range for accelerator driven particles). The neutron source may be any source that produces neutrons, e.g. a nuclear reactor, a fusion based source, a particle accelerator. The neutron spectrum is typically a fission spectrum neutron distribution.

The sapphire body is irradiated for a sufficient time at a neutron flux (neutrons/cm²/sec) that exposes the body to an integrated fluence that significantly increases the high temperature compressive strength of the body. The term "integrated fluence" (neutrons/cm²) means a neutron flux integrated over time. Suitable integrated fluences generally range from about $1 \times 10^{17}$ nvt to about $9 \times 10^{19}$ nvt, preferably from about $5 \times 10^{17}$ nvt to about $5 \times 10^{19}$ nvt, and more preferably from about $1 \times 10^{18}$ nvt to about $1 \times 10^{19}$ nvt.

The flux to which the body is exposed and the duration of exposure may vary. To generate an integrated fluence of about $1 \times 10^{17}$ nvt with a flux of $5.5 \times 10^{12}$ nvt, for instance, takes about 5 hours. To generate an integrated fluence of about $5 \times 10^{18}$ nvt at a flux of $5.5 \times 10^{12}$ nvt requires the sapphire body be irradiated for about 250 hours. From about $1 \times 10^{17}$ to about $1 \times 10^{19}$ the higher the integrated fluence to which a sapphire body is exposed, the higher the compressive strength of the body at 600° C. Bodies exposed to integrated fluences of about $4.3 \times 10^{18}$ nvt, for instance, have been found to have compressive strengths at 600° C. that are substantially more than 200% the compressive strength of a body exposed to an integrated fluence of about $1 \times 10^{17}$ nvt. It is believed that at some integrated fluence in the range of about $1 \times 10^{19}$ to about $9 \times 10^{19}$ the compressive strength of the body reaches a maximum.

The sapphire body is generally irradiated at atmospheric or near atmospheric conditions. The temperature during irradiation is generally low, i.e. up to about 200° C., more preferably up to about 100° C. Suitable irradiation temperatures are from about 50 to 150° C., more preferably from about 60 to about 100° C. The above-described operating conditions are illustrative and actual operating conditions may vary depending upon factors such as the dimensions of the sapphire body, the power of the neutron source, the amount of compressive strength desired in the irradiated body, and the like.

During irradiation, the neutron interactions with the sapphire body are generally evenly distributed throughout the body. When low energy neutron interactions occur, they result in the production of silicon within the sapphire structure as well as displacement spikes. Equation (1) depicts the neutron absorption and subsequent gamma decay reaction:

(1) 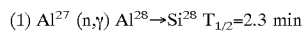 $T_{1/2}$=2.3 min

The aluminum and oxygen content of sapphire make the reaction of Equation (1) a likely reaction to occur under fission spectrum neutron irradiation.

The neutron radiation results in a structure that has crystal orientation with defect regions that are believed to pin the crystal lattice from slipping and mechanical twinning. These defect regions generally convert small, nanometer size regions of the crystal structure to amorphous regions.

Once a sapphire body has been irradiated and strengthened, the body is stored for a sufficient amount of time to allow for decay of activated aluminum, oxygen, and impurities, as well as high energy reaction by-products generated during the neutron irradiation. Generally, a suitable minimum storage time is about 2 to 4 weeks, after which extremely limited human contact can occur. As indicated above, a substantially longer period of time must pass before the material is considered completely safe, i.e. exhibits a radioactivity level of at most twice the background. The use of the preferred low energy neutron filters reduces the time periods.

Figure 3:
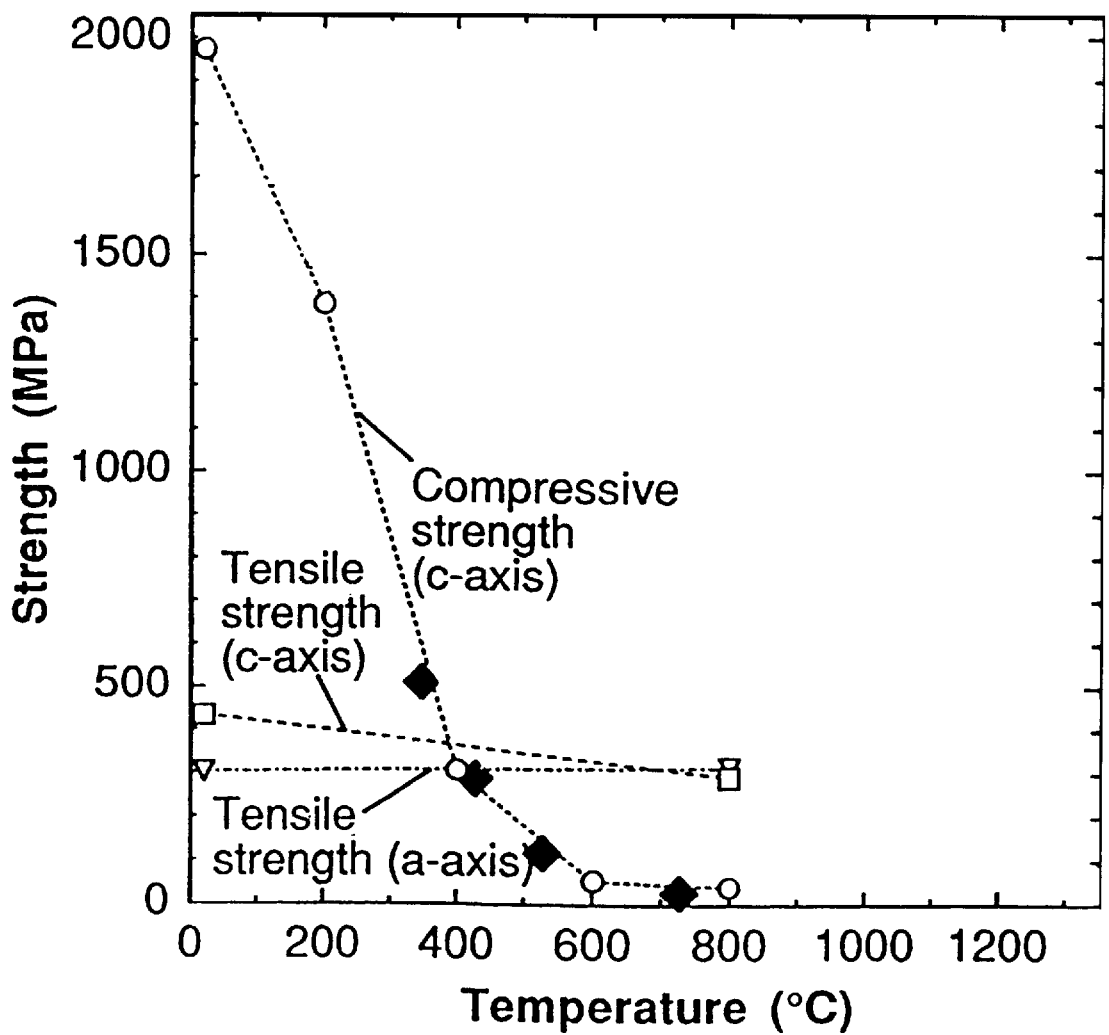
FIG. 3 is a graph showing the strength (a-axis tensile, c-axis tensile, and c-axis compressive) in MPa vs. temperature (°C.) for prior art strengthened sapphire bodies.

The strengthened sapphire bodies of this invention at temperatures greater than 400° C. exhibit a c-axis compressive strength which is greater than both the c-axis and a-axis tensile strengths of prior sapphire bodies. As can be seen in FIG. 3 where prior art strength data is graphically shown, the a-axis tensile strength of sapphire is substantially independent of temperature, increasing from about 300 to 350 Mpa from 0° C. up to 1,300° C. The c-axis tensile strength of sapphire from 0 to 800° C., behaves oppositely, declining with increasing temperature and ranges from about 430 MPa to about 390 MPa from 0° C. to 800° C. The c-axis compressive strength of prior art sapphire bodies is shown to be about 2000 MPa at 0° C., drops to less than 300 MPa at a temperature of about 400° C. and to less than 100 Mpa at a temperature of 600° C. and above.

Figure 6:
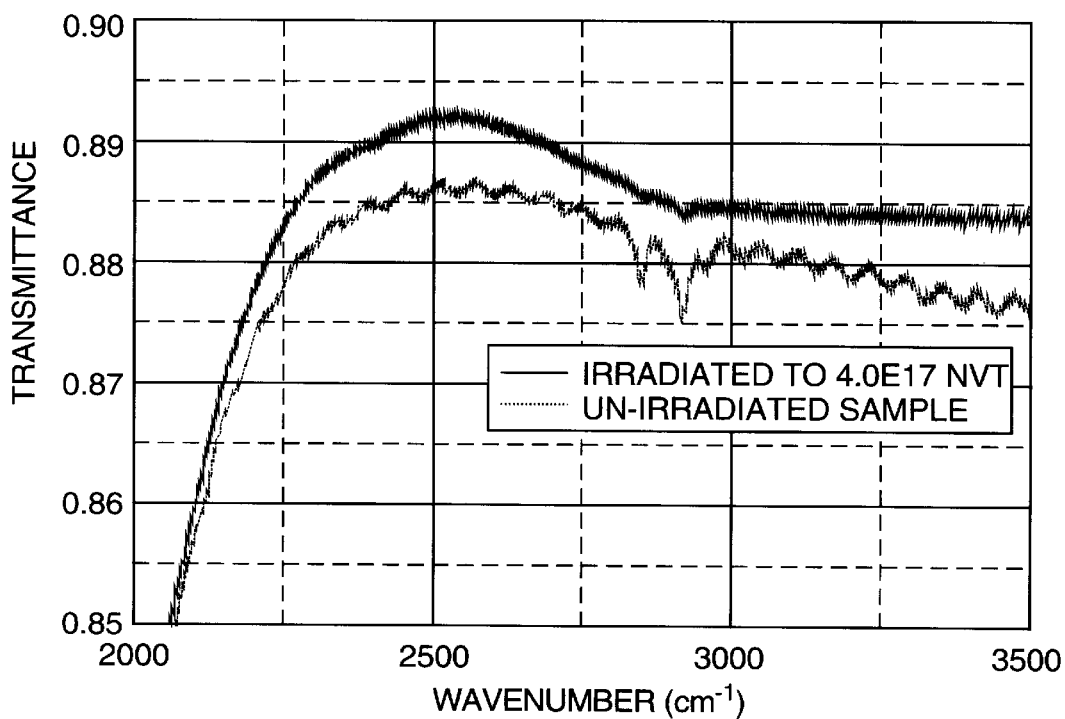
FIG. 6 is a graph of the transmittance of a 1 mm thick sapphire body in the 3–5 $\mu$m (2000–3,300 $cm^{-1}$) mid-wave region before and after the neutron irradiation of Example 6.

The sapphire body used in the sapphire window assembly embodiment of the invention is a neutron-irradiated sapphire body that has substantially increased high temperature compressive strength, throughout its crystal lattice, as compared to an unirradiated body. Preferably, the irradiated body is optically clear and has a desirable transmission in the 3–5 μm (2000–3,300 cm⁻¹) midwave region through the ultraviolet region. Optical analyses of sapphire irradiated under fast neutron environments have exhibited no adverse effects on transmittance in the 3–5 μm (2000–3,300 cm⁻¹) midwave infrared region, nor in the visual and ultraviolet light regions. (See FIGS. 6 and 7)

The crystal lattice of the sapphire body after irradiation is substantially free of a Si atoms that were transmuted from Al atoms due to slow neutron absorption. Generally, the amount of transmuted Si atoms will be less than 0.01 ppm, preferably less than 0.005 ppm, more preferably less than 0.001 ppm, and most preferably below the detection limit.

The lattice contains defect regions wherein a substantially uniform distribution of atoms displaced by neutrons from their original lattice sites to locations that are sufficiently far away from their original sites that they cannot return to those sites spontaneously. These defect regions can convert small regions of the crystal to amorphous structures that ordinarily have sizes in the nanometer size range. The irradiated sapphire crystal lattice also may have a substantially uniform distribution of vacancies (spaces formerly occupied by the displaced atoms). The material has a crystal orientation (alignment) with defect regions that are believed to pin the resulting crystal lattice and prevent the lattice from slipping and from mechanical twinning.

The sapphire body may have any crystal orientation that will enable it to be used in a sapphire window assembly at elevated temperature. Preferably, the orientation of the sapphire body is 0001 (or the basal plane) in which "0001" refers to the "Miller indice,"a well known method for describing the orientation of a crystal. Other orientations are within the scope of the invention.

Generally, the c-axis compressive strength of an irradiated sapphire body at 600° C. is at least four times the c-axis compressive strength of an unirradiated sapphire body at the same temperature. Preferably, the sapphire body has a compressive strength at 600° C. that is at least seven times the compressive strength of an unirradiated sapphire body at the same temperature. Conventional non-irradiated sapphire flexure coupons exhibit a c-axis compressive strength at 600° C. of about 50 MPa (as shown in FIG. 3). The c-axis compressive strength of a sapphire flexure coupon irradiated in accordance with this invention is at least 400 MPa, preferably at least 500 MPa, and more preferably at least 600 MPa. C-axis compressive strengths at 600° C. of irradiated sapphire bodies can range to 1500 MPa and even higher. Higher compressive strengths are within the scope of the invention.

Optical analysis of sapphire irradiated under fast and thermal neutron environments has found no adverse effects on transmittance in the 3–5 μm (2000–3,300 cm$^{-1}$) midwave infrared region. In some cases, the transmittance of irradiated bodies appears to have increased. The transmittance of the sapphire body in the 3–5 (2000–3,300 cm$^{-1}$) μm midwave infrared region is generally at least 0.75, and more preferably at least 0.85. Preferably, the transmittance of an irradiated sapphire body ranges from about 0.75 to 0.90, and more preferably from about 0.85 to 0.90. Other ranges are within the scope of the invention.

In one embodiment, the irradiated sapphire body may be post-treated with heat treating and compressive surface layer coatings. Suitable coatings may be found in Harris, *Infrared Window and Dome Materials IV*, Vol. TT10, SPIE Optical Engineering Press, 1992, Bellingham, Wash., the subject matter of which is incorporated herein by reference. To remove coloration, the irradiated body may be subjected to post-processing.

To make a sapphire window assembly, an irradiated sapphire body is simply secured in a casing, wall, door or another housing by conventional assembly techniques. Further details are well known in the art and are not included here.

The sapphire window assembly is preferably used in applications which require high compressive strength and high optical transmittance at high temperatures (200 to 1100° C.). For instance, the sapphire window assembly may be used in a furnace to enable workers to monitor the operation of the furnace. The sapphire window assembly may be used in doors or walls of nuclear reactors to enable operators to observe whether the reactor is functioning properly. The sapphire window assembly may also be used in applications where infrared windows or domes are useful. The sapphire window assembly may be used in chemical monitors and windows for semiconductor processing sight glass. Operating temperatures of such applications are typically at least about 200° C. Specific operating temperatures generally range from about 200 to about 1000° C., preferably from about 350 to about 800° C., and most preferably from about 500 to about 600° C. Other ranges are within the scope of the invention.

The strengthened sapphire body may have useful applications as a fiber for laser delivery and infrared spectroscopy or for temperature sensing in high temperatures environments. Other possible applications include optical fiber thermometry, and hostile environment testing. Transparent armor and ceramic ball bearings are other possible applications. Also, the high temperature compressive strength body may be useful in tools, thermocouple sheaths, custom-designed products and systems for CVD, diffusions, PVD, and plasma and etch applications. In the area of catalysis, the high temperature compressive strengthened sapphire body may be used as a catalyst carrier in a fluid-bed reactor. Alternatively, the body may be used to support a stationary-source catalyst designed for emission control. The bodies may be used in ceramic membranes in high temperature gas separation, biotechnology, environmental control, and gas separation industries. Other possible applications of the sapphire body include gas turbine components, solid oxide fuel cells, heat exchangers for indirect-fired gas turbines, substrates for catalytic combustors and electrolytes for sodium sulfur batteries. Engine components and propulsion systems are possible applications. It is also believed that neutron radiation may be able to strengthened sapphire fibers that may enable ceramic gas turbines to retain their structural strength while running at higher temperatures than conventional metal turbines (thereby improving efficiency). It is believed that materials other than sapphire can be strengthened at high temperature with a controlled level of neutron irradiation.

The invention is illustrated in the following nonlimiting examples.

EXAMPLE 1

A sapphire body is strengthened by neutron irradiation as follows. The body has a diameter of about ⅛" and a length of about ¼" with 0° crystal orientation. The body, grown by the heat exchanger method, is obtained from Crystal Systems, Inc., Salem, Mass. All surfaces of the body are polished and the body is cleaned with an acetone bath to remove any surface contaminates. Then, the body is packaged in an aluminum container and wrapped with aluminum foil. The foil-wrapped container is then inserted into a sealed aluminum container and the container is inserted into the core of the University of Massachusetts Lowell Radiation Laboratory, 1 Megawatt Research Reactor.

The reactor is configured to produce fast neutron fluxes of about $5.6 \times 10^{12}$ nvt. The reactor is operated for 50 hours at full power, exposing the body to a time-integrated flux of about $1 \times 10^{18}$ nvt. The temperature of the body during the irradiation is less than about 100° C. After being exposed to neutron irradiation for 50 hours, the material is removed and stored for about 3 weeks to allow for the decay of activated impurities and high energy reaction byproducts produced during irradiation. Sodium-24, for instance, produced by a neutron absorption/alpha particle release in stable aluminum (with a 15 hour half-life) is one of the materials that decays. After storage for 3 weeks, only trace amounts of activated impurities are found within the sapphire, based upon activation analysis using a high purity germanium gamma ray detector. These activated impurities are of no significant radiological concern. It takes about 6 months before the radiation is reduced to less than about twice the background.

EXAMPLE 2

The compressive strength at high temperature of a sapphire body irradiated as in Example 1 is determined by use of an Instron 55R1123 testing machine. Integrated with the Instron tester is a wire wound furnace capable of heating the test specimens up to a maximum about 800° C. The Instron testing machine measures the force necessary to move a crosshead a sufficient amount to compress the test specimens to mechanical failure. The compressive strength of the sapphire is then determined from the force and the area of the specimen.

Figure 2:
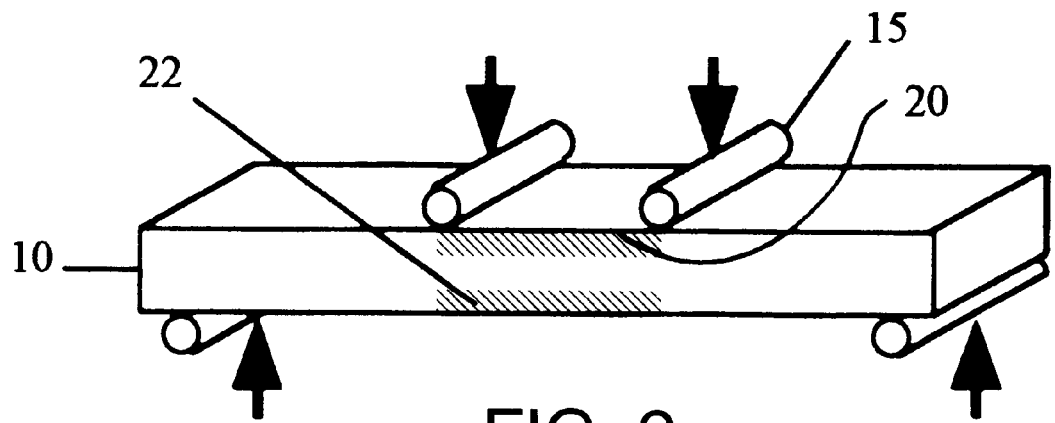
FIG. 2 identifies the c-axis compression strength testing apparatus used herein.

A sample 10 is placed in the Instron tester and silicon carbide spacers 15 are placed on the top and the bottom of a test sample 10 as shown in FIG. 2. In the test the upper surface 20 is in compression and the bottom surface 22 is in tension. The furnace is heated at a rate of 10° C./min for 60 minutes, i.e. until the temperature is about 600° C. The compressive load is applied with a crosshead speed of 0.02 in/min until the sample is crushed, i.e. compressed to failure. The load necessary for the material to fail is then divided by the area of the sample to determine the strength of the material. The procedure is repeated for three specimens. The results are provided in Table 1.

TABLE 1

Results of Example 2

| SPECIMEN | LOAD (lbs) | COMPRESSIVE (ksi) | STRENGTH (MPa) |
|---|---|---|---|
| 1 | 1066 | 89.28 | 615.6 |
| 2 | 1090 | 93.09 | 641.9 |
| 3 | 1063 | 92.14 | 635.3 |

Comparative Example A

To determine the extent of additional compressive strength imparted by the method of the invention, the procedure of Example 2 is repeated except that the test sample is not subjected to any neutron irradiation procedure. The results are shown in Table 2.

TABLE 2

Results of Comparative Example A

| SPECIMEN | LOAD (lbs) | COMPRESSIVE (ksi) | STRENGTH (MPa) |
|---|---|---|---|
| 4 | 104.8 | 9.07 | 62.5 |
| 5 | 92.6 | 7.8 | 54.4 |
| 6 | 97.7 | 8.33 | 57.7 |

The compressive strengths of the non-treated sapphire bodies is of the strength of the neutron irradiated sapphire of Example 2.

EXAMPLE 3

The procedure of Example 2 is repeated except that the furnace of the Instron test chamber is pre-heated to 600° C. before the samples are placed therein. The samples are evaluated for compressive strength as in Example 2. The results are provided in Table 3.

TABLE 3

Results of Example 3

| SPECIMEN | LOAD (lbs) | COMPRESSIVE (ksi) | STRENGTH (MPa) |
|---|---|---|---|
| 7 | 836.4 | 89.71 | 480.6 |
| 8 | 802.0 | 88.49 | 472.3 |
| 9 | 942.3 | 81.54 | 562.2 |

COMPARATIVE EXAMPLE B

To identify the additional strength imparted by neutron irradiation, the procedure of Example 3 is repeated except that the sample is not irradiated with neutrons, i.e. it is only subjected to a 600° C. heat treatment. The c-axis compressive strength results are in Table 4. The c-axis compressive strength of the heat treated non-irradiated sapphire body is less than 20% the strength of the neutron irradiated sapphire body of Example 3.

TABLE 4

Results of Comparative Example B

| SPECIMEN | LOAD (lbs) | COMPRESSIVE (ksi) | STRENGTH (MPa) |
|---|---|---|---|
| 10 | 98.8 | 8.54 | 58.9 |
| 11 | 134.5 | 11.47 | 79.1 |
| 12 | 85.4 | 7.15 | 49.3 |

EXAMPLE 4

The procedure of Example 2 is repeated except that during the testing procedure, pieces of graphfoil (a graphite foil) are placed between the test sample 10 and the silicon carbide spacers 15 prior to performing the compression strength test. The graphfoil is believed to evenly distribute the weight of the sapphire body over the silicon carbide test fixture. The compressive strength of the sapphire bodies are determined according to the procedure of Example 2 and the results are given in Table 5.

TABLE 5

Results of Example 4

| SPECIMEN | LOAD (lbs) | COMPRESSIVE (ksi) | STRENGTH (MPa) |
|---|---|---|---|
| 13 | 1095 | 83.3 | 574 |
| 14 | 1180 | 89.7 | 619 |
| 15 | 1112 | 84.7 | 584 |
| 16 | 1457 | 110.8 | 764 |
| 17 | 1432 | 108.9 | 751 |
| 18 | 1005 | 76.4 | 527 |

While the use of graphfoil during strength testing increases the reported compresssive strength data, it does not actually change the strength.

COMPARATIVE EXAMPLE C

The procedure of Example 4 is repeated with a sample which is not irradiated with neutrons in accordance with the present invention The compressive strength of the sapphire body is determined with the use of graphfoil. This results in a reporting of an artificially high value. The result is shown in Table 6.

TABLE 6

Results of Comparative Example C

| SPECIMEN | LOAD (lbs) | COMPRESSIVE (ksi) | STRENGTH (MPa) |
|---|---|---|---|
| 19 | 459.7 | 38.7 | 274 |

The use of graphfoil during testing, although producing a higher compressive strength value than in Comparative Example A, still produces compressive strength value which are vastly lower than those obtained by the present invnetion.

EXAMPLE 5

To demonstrate that the method did not adversely affect the transmission characteristics of sapphire in the 3–5 $\mu$m (2000–3,300 $cm^{-1}$) midwave region, a series of sapphire irradiations are performed. Prior to irradiation, the transmittance of the sapphire body is measured using a Bruker Fourier Transform Infrared Spectrometer. Two flat sapphire bodies having diameters of 25.4 mm and thicknesses of 1 and 2 mm, respectively, are used. The bodies are then irradiated as in Example 1 at a temperature of 373° K for about 80 hrs at the UML Research Reactor. The samples are exposed to a flux of approximately $1.5 \times 10^{12}$ neutron/cm$^2$-sec and an integrated fluence of about $4.0 \times 10^{17}$ nvt. After irradiation, a two week period is allowed for the decay of activated impurities and high energy reaction by-products.

Figure 7:
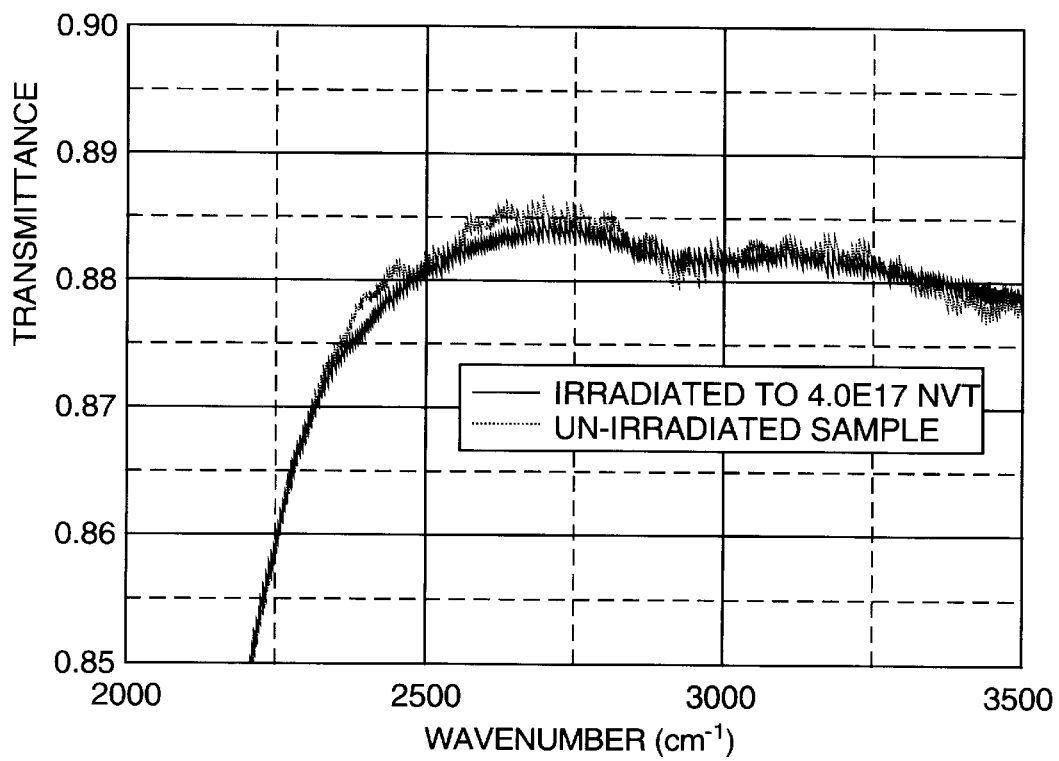
FIG. 7 is a graph of the transmittance of a 2 mm thick sapphire body in the 3–5 $\mu$m (2000–3,300 $cm^{-1}$) mid-wave region before and after the neutron irradiation of Example 6.
Figure 8:
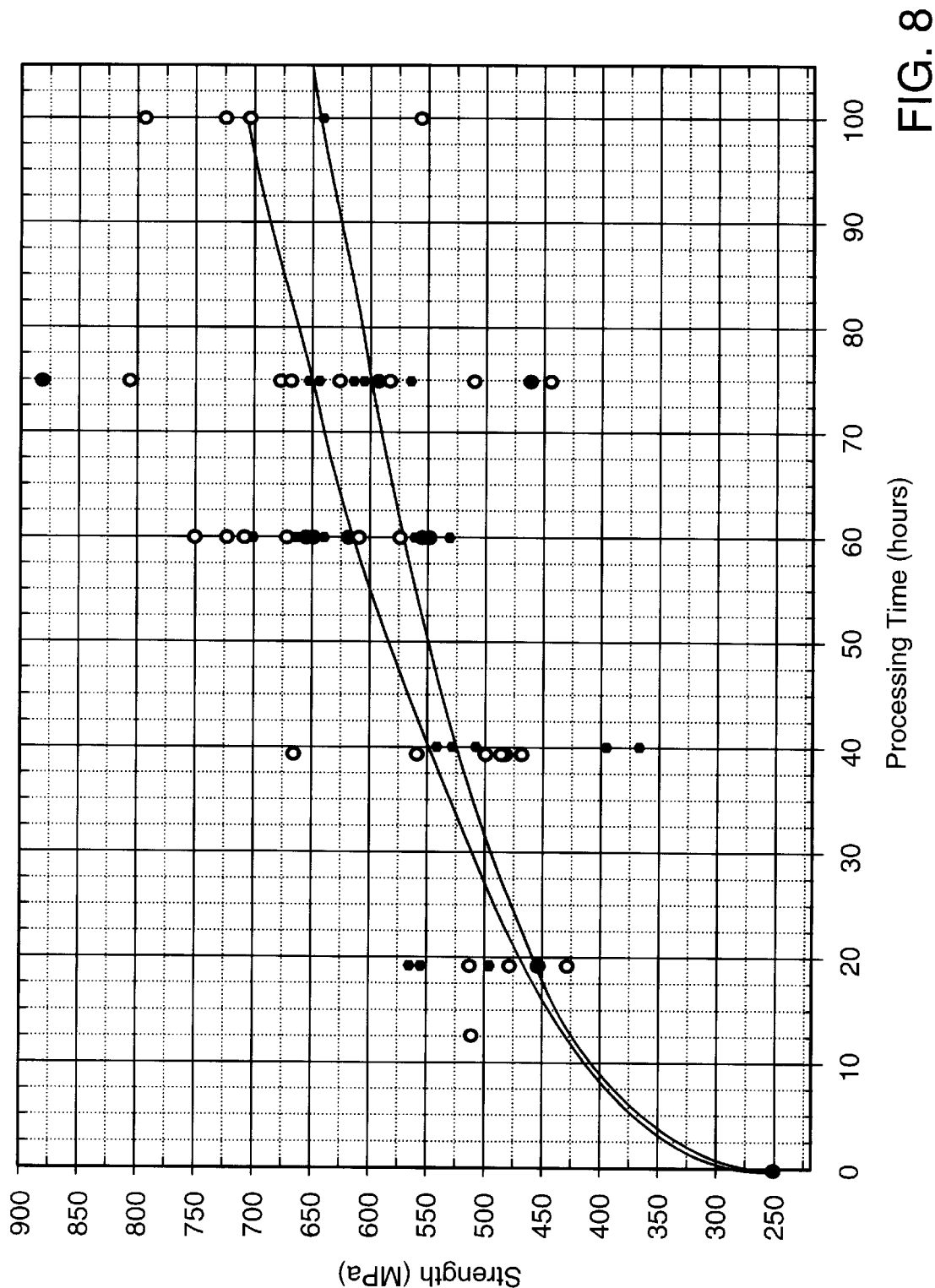
FIG. 8 is a compressive strength response curve showing the c-axis compressive strength (MPa) vs Processing Time (hrs) of multiple samples prepared using low energy neutron filters.

The results, shown in FIGS. 7 and 8, indicate no adverse effects on the transmission characteristics of the sapphire bodies in the midwave region. Moreover, for the 1 mm thick sample (see FIG. 7), the irradiation processing resulted in an improvement in transmission in the 3–5 $\mu$m (2000–3,300 cm$^{-1}$) midwave infrared region (wavenumber (cm$^{-1}$) of 2000–3,300). (The transmittance at 3 $\mu$m is about 0.75 for the irradiated and unirradiated samples in both Figures).

EXAMPLE 6

The procedure of Example 5 is repeated except that the sapphire body had a diameter of 1 inch and a thickness of 1.37 mm and the body is irradiated for 55 hours. The flux during irradiation was $5.5 \times 10^{12}$. The results indicate no adverse effects on the transmission characteristics of the sapphire cylinder in the midwave region.

EXAMPLE 7

The procedure of Example 6 is repeated except that the sapphire body is irradiated for 165 hours. The results indicate no adverse effect on the transmission characteristics of the sapphire cylinder in the midwave region.

EXAMPLE 8

The procedure of Example 1 is repeated except that the sapphire bodies are irradiated for an extended period of time, i.e. 215 hours. As a result, the sapphire is exposed to an integrated fluence of about $4.3 \times 10_{18}$ nvt vs $1 \times 10^{18}$ nvt of Example 1.

The c-axis compressive strength of the sapphire bodies is determined at 600° C. according to the procedure of Example 2. The results in the Table 7 show the compressive strength of the these sapphire bodies is substantially higher than those of Example 2.

TABLE 7

Results of Example 8

| SPECIMEN | LOAD (lbs) | COMPRESSIVE STRENGTH (ksi) | (MPa) |
| --- | --- | --- | --- |
| 20 | 1951 | 140.7 | 970 |
| 21 | 1985 | 150.7 | 1000.4 |
| 22 | 1933 | 147 | 1013 |
| 23 | 1885 | 143.6 | 990 |
| 24 | 1815 | 138 | 952 |
| 25 | 1546 | 117 | 812 |

EXAMPLE 9

The procedure of Example 1 is repeated except that sapphire cylinders are irradiated for only 15 hours, i.e. exposed to a lower integrated fluence of about $3 \times 10^{17}$ nvt. The compressive strength of the sapphire cylinders are determined according to the procedure of Example 2. The compressive strength of the irradiated sapphire bodies is enhanced over non-irradiated sapphire bodies but is substantially lower than the bodies of Example 8 which are exposed to higher integrated fluence. The results are shown in Table 8.

TABLE 8

Results of Example 9

| SPECIMEN | LOAD (lbs) | COMPRESSIVE STRENGTH (ksi) | (MPa) |
| --- | --- | --- | --- |
| 26 | 659 | 56.1 | 387 |
| 27 | 630 | 54.5 | 376 |
| 28 | 639 | 54.4 | 375 |

EXAMPLE 10

The procedure of Example 9 is repeated except that the sapphire cylinder is irradiated for about 500 hours so that the body is exposed to an integrated fluence of about $1 \times 10^{19}$ nvt. At 600° C., the body has a compressive strength of about 1500 MPa.

EXAMPLE 11

An irradiated sapphire body is used as a window in a metal wall by first making an opening in a 7.6 cm thick wall by marking a 14.1×14.1 cm square on the wall where the sapphire is to be installed. A metal cutting tool cuts along the marked segments through the entire thickness of the wall and the corresponding portion of the wall is removed. An edge in which the sapphire body can be placed and secured is formed by marking a 15.8×15.8 cm square around the opening and using a metal cutting tool along the marked segment to a depth of about 1.3 cm. Then, the metal cutting device cuts perpendicularly 0.50" into the wall along the marked segment and the corresponding portion of the wall is removed to form an edge. A high-temperature-resistant active metal braze is applied on the outer edge of the sapphire body and the sapphire is secured in the edge.

EXAMPLE 12

The procedure of Example 1 is repeated except that prior to performing the irradiation, the sapphire sample is encased within a cadmium filter sheet about 0.04" thick to prevent most thermal neutrons, i.e. low energy <0.5 eV neutrons, from striking the sapphire body. Specifically, after the sapphire is packaged in an aluminum container and wrapped with aluminum foil, the foil wrapped container is encased within the filter material and then inserted into the sealed aluminum container for irradiation.

EXAMPLE 13

The procedure of Example 12 is repeated except that prior to performing the irradiation, the sapphire sample is encased within first a boron-10 filter in the form of a sheet of boron-10 doped aluminum (0.0625" thick) from Eagle Pitcher Co, and then a cadmium filter about 0.04" thick to prevent neutrons with energy levels below about 1.0 MeV from striking the sapphire body. Specifically, after the sapphire is packaged in an aluminum container and wrapped with aluminum foil, the foil wrapped container is encased within the filter material(s) and then inserted into the sealed aluminum container.

EXAMPLE 14

The sapphire samples of Examples 12 and 13 are irradiated for time periods ranging from 12 to 100 hours at neutron fluxes of about $5.5\times10^{12}$ nvt, thereby corresponding to time-integrated fluences of ranging from about $2.4\times10^{17}$ to $2\times10^{18}$ nvt.

The samples are then evaluated for strength as in Example 2. The results are shown in FIG. 8 which is a Compressive Strength Response Curve of strength vs processing time wherein the open circles represent results obtained with only the cadmium filter of Example 12, and the closed circles represent results obtained with the dual filter system of cadmium and boron-10 of Example 13.

What is claimed is:

1. A method for increasing the c-axis compressive strength of a sapphire body at 600° C comprising irradiating the sapphire body with a controlled amount of fast neutron irradiation so as to produce a body having a high temperature c-axis compressive strength greater than that of a non-irradiated sapphire body.

2. The method of claim 1, wherein the controlled amount of neutron radiation is at a rate and for a period which increases the c-axis compressive strength of the unirradiated sapphire body to a value greater than the c-axis tensile strength.

3. The method of claim 1, wherein the strength is increased to such an extent that the sapphire body fails in tension and not in compression.

4. The method of claim 1, wherein the sapphire body is modified to such an extent that no crystal twin planes are observed in c-axis strength testing at 600° C.

5. The method of claim 1, wherein the thickness is about 1 to about 3 mm.

6. The method of claim 1, wherein the sapphire body is irradiated to an integrated fluence ranging from about $1\times10^{17}$ nvt to about $9\times10^{19}$ nvt.

7. The method of claim 1, wherein the sapphire body is irradiated to an integrated fluence ranging from about $1\times10^{18}$ nvt to about $1\times10^{19}$ nvt.

8. The method of claim 1, wherein the sapphire body is irradiated with neutron radiation having a flux of about $5.5\times10^{12}$ nvt for periods ranging from about 10 to 500 hours.

9. The method of claim 1, wherein after irradiation the irradiated sapphire body is stored for a sufficient amount of time to allow for the decay of impurities and high energy reaction by-products produced during irradiation.

10. The method of claim 1, wherein the sapphire body is in the shape of a dome.

11. The method of claim 1, wherein the sapphire body is encased in a low energy neutron removing filter during the irradiation.

12. The method of claim 1, a the filter removes neutrons having an energy level below the level at which the neutron possesses sufficient energy to produce significant atom displacements within the sapphire body.

13. The method of claim 12, wherein the filter comprises a material selected from the group consisting of cadmium, boron-10 and combinations thereof.

14. The method of claim 1, wherein the irradiation is performed at a temperature of from room temperature to about 200° C.

15. The method of claim 1, wherein the irradiation is performed at a temperature of about 60 to about 100° C.

16. A sapphire window useful at a temperature of about 600° C. and above which comprise a sapphire body prepared by the method of claim 1 attached to a frame.

17. The method of claim 1 wherein the sapphire body is contoured into a suitable shape with a suitable cutting device after undergoing irradiation.

18. The method of claim 1 wherein the sapphire body is contoured into a suitable shape with a suitable cutting device before undergoing irradiation.

* * * * *